United States Patent [19]

Tsui

[11] Patent Number: 5,896,270
[45] Date of Patent: Apr. 20, 1999

[54] HEAT SINK SPRING CLIP

[75] Inventor: Jonathan H. K. Tsui, City One Shatin, The Hong Kong Special Administrative Region of the People's Republic of China

[73] Assignee: Artesyn Technologies, Inc., Fremont, Calif.

[21] Appl. No.: 08/859,766

[22] Filed: May 21, 1997

[51] Int. Cl.[6] .................................................. H05K 7/20
[52] U.S. Cl. ...................... 361/704; 361/707; 361/709; 361/718; 361/719; 257/718; 257/719; 257/727; 165/80.2; 165/80.3
[58] Field of Search ............................. 361/704, 707, 361/717, 718; 257/718, 719, 727, 726; 165/80.3; 24/458, 295, 293; 411/477

[56] References Cited

U.S. PATENT DOCUMENTS

| | | | |
|---|---|---|---|
| 2,825,948 | 1/1958 | Parkin | 411/477 |
| 3,673,643 | 7/1972 | Kindell | 24/458 |
| 4,964,198 | 10/1990 | McCarthy | 24/458 |
| 5,466,970 | 11/1995 | Smithers | 257/712 |
| 5,563,450 | 10/1996 | Bader et al. | 257/785 |

*Primary Examiner*—Leo P. Picard
*Assistant Examiner*—Boris L. Chervinsky
*Attorney, Agent, or Firm*—Skjerven, Morrill, MacPherson, Franklin & Friel, LLP

[57] ABSTRACT

A spring clip includes a continuous spring band forming an angular integral first spring finger for pressing an electronic device package against a flat surface of an apertured substrate. A first bend of less than 90° forms a substantially linear intermediate first band portion extending at an acute angle from the spring finger and a second bend of about 180° extends from the intermediate first band portion, these portions together forming an integral U-shaped member including at least one compressible barb for insertion into a substrate aperture to lock the chip in the substrate and to press a device package between the finger and the substrate. In one embodiment two spring fingers and two oppositely-facing barbs are provided on the U-shaped member so that two spaced packages can be clamped simultaneously on a substrate surface while utilizing a single aperture for the U-shaped member.

11 Claims, 2 Drawing Sheets

HEAT SINK SPRING CLIP

BACKGROUND OF THE INVENTION

1. Field of Invention

The present invention relates to the mounting of packaged electronic assemblies to a substrate. More particularly the invention is directed to a spring clip for mounting a heat sink-containing packaged transistor device or other electronic device to a heat sink substrate which removes heat generated by the device.

2. Description of Related Art

As seen in FIG. 1 a conventional spring clip 10 is of an inverted U-shape configuration and includes a central inwardly-bent bight portion 11 overlying a transistor device package 18, with bent tip ends 12, 14 which by a bi-directional motion, vertical and horizontal, is inserted into a heat sink panel 15. The tip ends 12, 14 are spring pressed into respective oval apertures 16, 17 in panel 15 so that the bent bight portion forces the device package 18 against the heat sink panel. The tip bent ends of adjacent clips, e.g. end 12, may share a common panel aperture 16 with an adjacent clip or both clip tip bent ends, e.g. ends 12, 14, may be clipped into separate panel apertures 16, 17. A separate clip 10 is needed for each package 18 and at least four panel apertures are necessary to mount three linearly-aligned packages. Such apertures, as is apparent, lessen the heat rejection area of the heat sink panel. Likewise, only a very small contact area at the central bend 11 is in contact with the top of the package and since the clip 10 is relatively narrow in width i.e. about 3 mm, only a very small heat conduction path is provided from the typical 8 mm wide package top. This results in a limited clip area provided for radiation of whatever little heat is conducted from the package to the clip. Terminal leads 19 typically extend from a side wall of the device package.

SUMMARY OF THE INVENTION

A heat rejecting mounting for an electronic device package, such as a transistor, diode or other semiconductor device package, includes a heatsink having an aperture through which a spring clip is pressed to clamp the package to the heatsink. In one embodiment the spring clip may mount a single package on the heatsink using a single aperture and in another embodiment the spring clip may mount two spaced packages on the substrate again using a single aperture. The result is an easily automated, cost effective way of mounting a package or packages on a heatsink or other substrate. The spring clip may be pre-mounted on the heatsink and the package placed under a first spring finger of the clip in a press-fitted connection with a surface of the heatsink. The spring clip is assembled in a uni-direction such as by a downward force thus minimizing the cost, time and investment of automatic assembly of the spring clip to the heatsink. In providing a single, relatively small, preferably rectangular aperture or slot for each clip for one or a pair of packages the total negative effect of the aperture or slot on the total heat rejecting area of the heatsink is minimized. The spring clip of the invention is balanced i.e. stabilized by the force components from spring finger 21, central barb 32 and distal lip 30. This will provide a continuous pressure to the device package or pair of packages under the operating environment of the packages.

The above attributes are attained by the use of a clip having a continuous spring band having a clamping portion inward of a first band end forming an angular integral first spring finger adapted to press on a flat surface of the electronic device package; a first bend of less than 90° forming a substantially linear intermediate first band portion extending at an acute angle from the clamping portion; a second bend of about 180° extending from the intermediate band portion forming a second band portion generally parallel to and spaced from the intermediate band portion; and a third bend extending outwardly from the second band portion forming a band distal lip adapted for holding the clip with respect to the substrate. A portion of the intermediate first band portion and a portion of the second band portion is pushed through the substrate aperture to lock the package against the substrate. In one embodiment one package is mounted on the heatsink or substrate using a clip having one clamping spring finger and one barb for holding both the clip and the package in heat rejecting abutment with a surface of the heatsink using a single aperture and in a second embodiment two clamping spring fingers and two barbs are provided on the spring clip so that two spaced packages can simultaneously be clamped on the heatsink surface also utilizing a single aperture.

DETAILED DESCRIPTION

Figure 1:
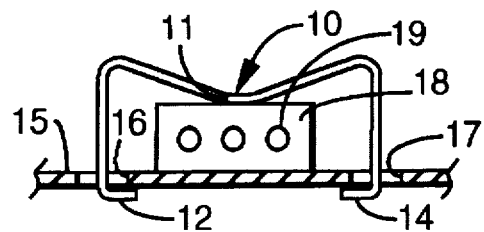
FIG. 1 is a side view partially in section of a prior art spring clip for clamping an electronic device package to a substrate.
Figure 2:
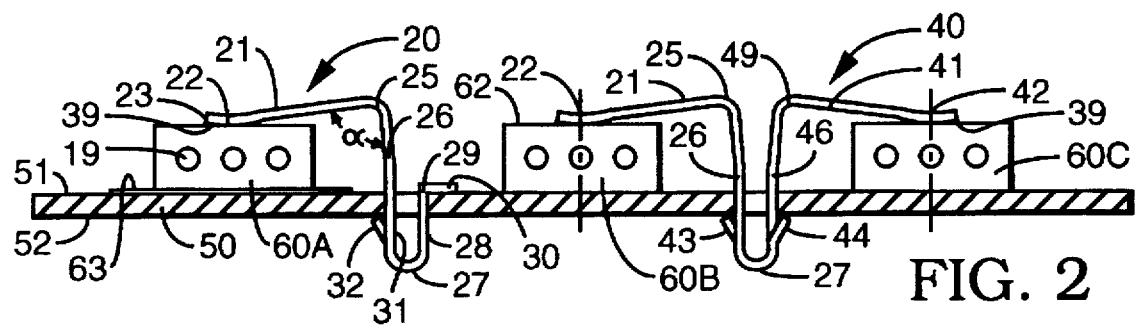
FIG. 2 is a side view partially in section of a heat rejecting mounting for a series of electronic device packages using the spring clips of the invention.

Two embodiments of the invention are seen in FIG. 2 where a single electronic device package 60A is mounted on a heatsink or substrate 50 by a spring clip 20 pressed into an aperture 53A in the heatsink 50 and a pair of electronic device packages 60B and 60C are mounted on the heatsink 50 by a spring clip 40 pressed into a similar aperture 53B in the heatsink 50. Each spring clip 20 and 40 comprises a continuous spring band with a similar one side including a clamping portion forming an angular integral first spring finger 21 extending inwardly from a first band end 23 which acts to clamp at area 22 against a top surface of package 60A. The package 60A, upon clamped assembly, is in abutment with a top flat surface 51 of the heatsink 50 either directly or in one embodiment on an optional, rectangular or other shaped electrical insulator sheet 63, preferably having a high coefficient of heat transfer. The insulator sheet 63 typically would be a mica sheet or a silicone rubber sheet of about 10 mil thickness.

Figure 4:
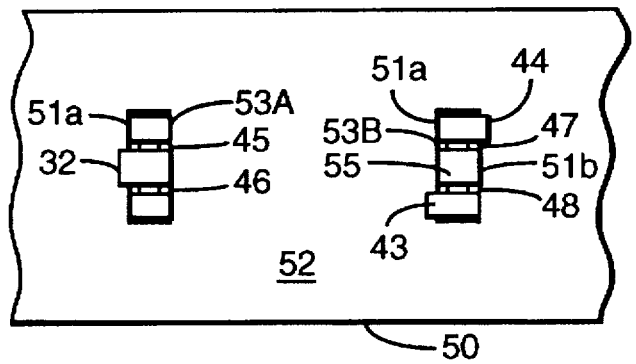
FIG. 4 is a bottom view thereof.

A first bend 25 of less than 90° forms a depending substantially linear intermediate first band portion 26 extending at an acute angle α of from about 40°–80° from spring finger 21 in a pre-insertion mode, preferably at an angle of about 65°, to a second bend 27 of about 180° to then form a second band portion 28 generally parallel to (in operational locking mode) and spaced from the intermediate first band portion 26, together forming an intergral U-shaped member for insertion into a substrate aperture. The first bend 25 includes a central aperture in the form of a rectangular slot 25a which facilitates bending and leaves a pair of bent integral connecting links between the first spring finger 21 and the intermediate first band portion 26. In a first embodiment a third bend 29 extends outwardly (oppositely relative to spring finger 21) from the second band portion 28 forming a band distal lip 30. The bottom portion 31 of the intermediate band portion 26 is pushed into aperture 53A until distal lip 30 seats on surface 51 and the end of a spring barb 32 adjacent to the intersection of the intermediate first band portion 26 and the second bend 27 springs outwardly to seat against an opposite under surface 52 of the heatsink 50 immediately adjacent to one edge 51a of two opposed linear edges 51a, 51b of the heatsink aperture 53A (FIG. 4). The central barb 32 is formed by slits 45, 46 (cut-outs) in portion 31 adjacent to bend 27.

FIG. 2 also illustrates a second embodiment of the invention where the second band portion 28 of the first embodiment is an intermediate second band portion 46 which extends generally parallel to the intermediate first band portion 26 to a third bend 49 also forming an angle α with a second spring finger 41 which is spring pressed at 42 against a top flat surface of package 60C. Since the illustrated left side of clip 40 is the same as the left side of clip 20, particularly in showing the spring finger 21 clamping package 60B, it is seen that spring clip 40 simultaneously clamps two linearly spaced packages utilizing only one heatsink aperture 53B. In this second embodiment barbs 43 and 44 are formed adjacent to the outer edges of the bend 27 by parallel slits 47, 48 with a central link 55 therebetween bisecting the bend 27. The spring finger 41 has the same profile and height as spring finger 21 so that two packages 60B and 60C of the same height can be clamped on heatsink 50. In some applications spring fingers 21 and 41 in a double clip can be at different heights to accommodate packages of different height. A slightly bent tip 39 is provided at the ends of the clips for lifting the spring fingers 21 and 41 from the packages, if it is desired to remove a package(s) from the heatsink 50 for analysis or replacement.

Figure 3:
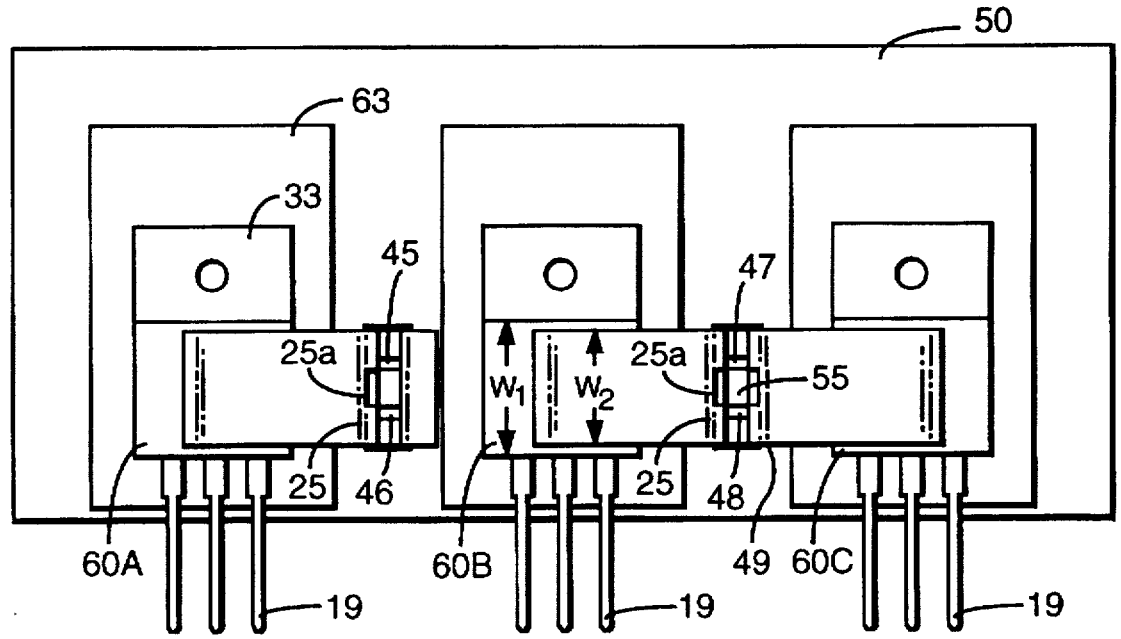
FIG. 3 is a top view thereof.

In a preferred embodiment as seen in FIG. 3 the single spring clip 20 and the double spring clip 40 both have a width $W_2$ closely approaching the width $W_1$ of a transistor package (not counting the length of leads 19). Typically $W_1$ of the package will be about 8 mm and width $W_2$ of the clip will be about 7 mm. The width $W_2$ will be from about 40 to 100% of $W_1$. The overall longitudinal length of the clips 20 and 40 in their bent form will be about 17 mm and 26 mm, respectively. The heatsink 50 is typically made of a 1100-H14 aluminum alloy having a thickness of from about 1 to 2 mm. A heat conducting tab 33 extends from the typical transistor and diode package (60A–60C) and are spring finger pressed against the heatsink 50 to assist in transferring heat from the package to the heatsink 50. Preferably the spring clips 20 and 40 are made from about 0.3 mm thick SUS 301-3/4H stainless steel. The effective clamping range of the spring fingers 21 and 41 as shown in the drawings is from about 4 to 6.4 mm.

Figure 5:
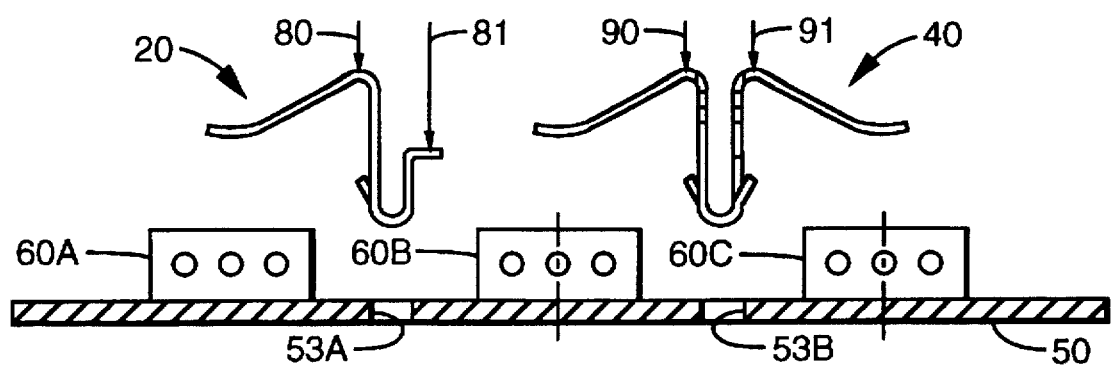
FIG. 5 is a side view of a first assembly step orienting the spring clip or spring clips with a heatsink.
Figure 6:
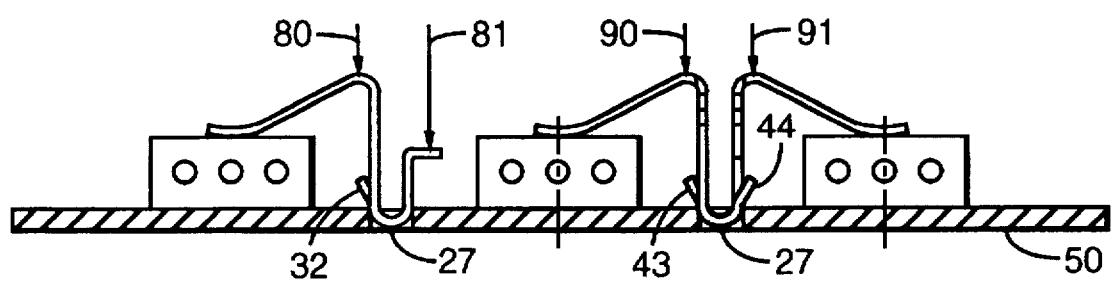
FIG. 6 is a side view of a subsequent step where a second bend of each spring clip enters an aperture of the heatsink.
Figure 7:
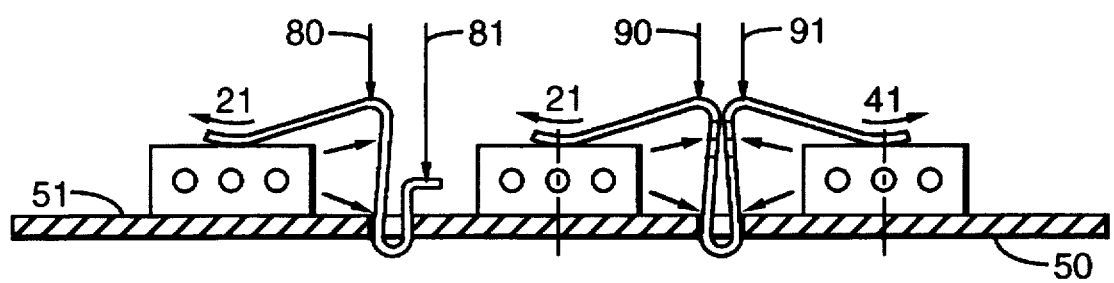
FIG. 7 is a side view of a still subsequent step showing the downward force and the compression of the portions of the clip within the aperture.
Figure 8:
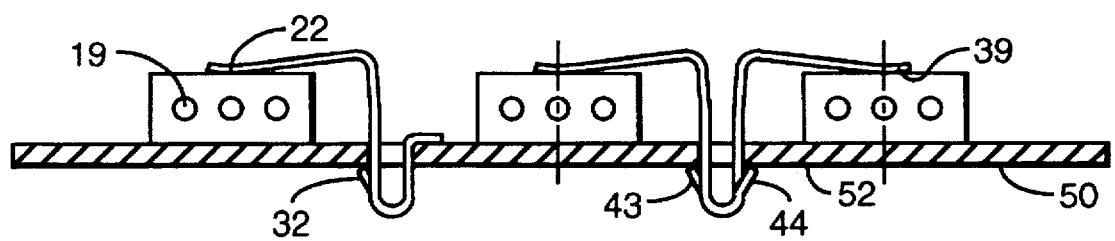
FIG. 8 is a side view of a final step where a barb(s) of the spring clip latches against an opposite surface of the heatsink to lock the package(s) on a first surface of the heatsink.

The assembly of the spring clips 20 and 40 to the heatsink 50 is seen in FIGS. 5–8. First as seen in FIG. 5 the spring clips 20 and 40 are oriented by suitable automatic fixturing (not shown) or manually, individually or together aligned with respective heatsink apertures 53A and 53B. A downward or transverse force (arrows 80, 81) is applied (FIG. 6) to bend 25 and the distal lip 30 (FIG. 2) of the single spring clip 20 and a similar force (arrows 90, 91) applied to bends 25 and 49 (FIG. 2) of the double spring clip 40. The spring clips 20 and 40 may be forced down directly onto the package(s) 60A (60B and 60C) and into the heatsink apertures 53A and 53B or may be pre-mounted loosely in the heatsink panel. The respective forces push the bends 27 into heatsink apertures 53A and 53B. As the spring clips 20 and 40 are further pushed into the apertures 53A and 53B (FIG. 7) the barb 32 and barbs 43, 44 are compressed and the spring fingers 21 and 21, 41, respectively, slide outwardly on the top surface of the respective packages 60A–60C and clamp the packages 60A–60C against the top surface 51 of the heatsink 50. As seen in FIG. 8 as the force stroke is completed, the barbs 32 and 43,44 spring outwardly to lock adjacent the underside 52 of the heatsink 50 adjacent to the edge 51a of aperture 53A and edges 51a and 51b of aperture 53B, as seen also in FIG. 4. The respective packages 60A and 60B, 60C are then firmly clamped and locked onto the top surface 51 of the heatsink 50. It is understood that in some applications the double spring clip 40 may be used also to mount a single package either under spring finger 21 or spring finger 41.

The above description of embodiments of this invention is intended to be illustrative and not limiting. Other embodiments of this invention will be obvious to those skilled in the art in view of the above disclosure.

I claim:

1. A spring clip for mounting an electronic device package to a surface of a substrate having an aperture, the clip comprising a continuous spring band including a clamping portion forming an angular integral first spring finger which in use presses on a top surface of an electronic device package between the finger and the substrate;

a first bend of less than 90° forming a substantially linear intermediate first band portion extending at an acute angle from said clamping portion;

a second bend of about 180° extending from said intermediate band portion forming a second band portion generally parallel to and spaced from said intermediate band portion, said intermediate band portion and said second band portion together forming a U-shaped member for insertion into a substrate aperture; and a third bend extending outwardly from said second band portion forming a band distal lip for holding the clip with respect to the substrate, said U-shaped member including at least one compressible barb extending angularly toward said spring finger such that when the clip is in use, said U-shaped member is pushed through the substrate aperture and the at least one compressible barb springs outwardly to lock the clip against the substrate.

2. The spring clip of claim 1 wherein said third bend is about 90° and said distal lip is adapted to overlie the surface of the substrate on which the package is mounted.

3. The spring clip of claim 1 wherein a portion of the spring band in which the first bend is formed includes a central aperture forming a pair of bent integral connecting links between said clamping portion and said intermediate first band portion.

4. The spring clip of claim 1 wherein a portion of the spring band in which the second bend is formed includes a pair of longitudinal slits, a central part of said second bend between said slits forming said at least one compressible barb.

5. The spring clip of claim 1 wherein said third bend is less than 90° and said distal lip extends outwardly from said second band portion forming a second spring finger having a profile corresponding to a profile of said first spring finger and extending in an opposite direction than said first spring finger for locking a spaced second electronic package against the substrate surface.

6. The spring clip of claim 5 wherein said first spring finger and said second spring finger each includes a bent tip for lifting said spring fingers from the electronic packages to remove the electronic packages from the substrate.

7. The spring clip of claim 1 wherein said at least one compressible barb includes a pair of oppositely extending barbs, one barb being adjacent to the intersection of said intermediate first band portion and said second bend and the other barb being adjacent to the intersection of said second bend and said second band portion.

8. The spring clip of claim 1 wherein the first bend has an included acute angle of from 40° to 80° in a pre-insertion mode.

9. The spring clip of claim 8 wherein the first bend has an included acute angle of about 65°.

10. A spring clip for mounting an electronic device package to a surface of a substrate having an aperture, the clip comprising a continuous spring band including a clamping portion forming an angular integral first spring finger which in use presses on a top surface of an electronic device package between the finger and the substrate;

a first bend of less than 90° forming a substantially linear intermediate first band portion extending at an acute angle from said clamping portion;

a second bend of about 180° extending from said intermediate band portion forming a second band portion generally parallel to and spaced from said intermediate band portion; and a third bend extending outwardly from said second band portion for holding the clip with respect to the substrate, a portion of said intermediate first band portion and second band portion being pushable in use through the substrate aperture to lock the package against the substrate;

further including at least one barb extending inwardly from said intermediate first band portion, said at least one barb being seatable on an opposite surface of the substrate, when the intermediate first band portion is pushed through the substrate aperture;

wherein said third bend is less than 90° and said spring band extends outwardly from said second band portion forming a second spring finger having a profile corresponding to a profile of said first spring finger and extending in an opposite direction than said first spring finger for locking a spaced second electronic package against the substrate surface; and wherein a portion of said spring band in which said second bend is formed includes a pair of longitudinal slits, a central part of said second bend between said slits forming a connector link and wherein outer edges of said second bend form a pair of barbs for seating on an opposed surface of the substrate to lock the electronic packages against the substrate.

11. A spring clip for mounting an electronic device package to a surface of a substrate having an aperture, the clip comprising a continuous spring band including a clamping portion forming an angular integral first spring finger which in use presses on a top surface of an electronic device package between the finger and the substrate;

a first bend of less than 90° forming a substantially linear intermediate first band portion extending at an acute angle from said clamping portion;

a second bend of about 180° extending from said intermediate band portion forming a second band portion generally parallel to and spaced from said intermediate band portion; and a third bend extending outwardly from said second band portion forming a band distal lip for holding the clip with respect to the substrate, a portion of said intermediate first band portion and second band portion being pushable in use through the substrate aperture to lock the package against the substrate;

further including at least one barb in said spring band adjacent to said second bend; and wherein said at least one barb extends at an acute angle outwardly from said spring band such that in use the at least one barb is spring-pressed inwardly when said portion of said intermediate first band portion is being pushed through the substrate aperture and springs back outwardly against an opposite surface of the substrate when the first spring finger has been pressed down on the package.

* * * * *